United States Patent
Romano et al.

(10) Patent No.: US 6,355,497 B1
(45) Date of Patent: Mar. 12, 2002

(54) REMOVABLE LARGE AREA, LOW DEFECT DENSITY FILMS FOR LED AND LASER DIODE GROWTH

(75) Inventors: Linda T. Romano, Sunnyvale; Brent S. Krusor, Fremont; Christopher L. Chua, San Jose; Noble M. Johnson, Menlo Park, all of CA (US); Rose M. Wood, Sun City, AZ (US); Jack Walker, Georgetown, TX (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 09/490,286

(22) Filed: Jan. 18, 2000

(51) Int. Cl.⁷ .............................................. H01L 21/00
(52) U.S. Cl. ....................................................... 438/39
(58) Field of Search .............................. 438/33, 39, 46, 438/47, 455, 458, 459, 479, 481, 938

(56) References Cited

U.S. PATENT DOCUMENTS

| | | |
|---|---|---|
| 4,551,394 A | 11/1985 | Betsch et al. |
| 4,557,794 A | 12/1985 | McGinn et al. |
| 4,760,036 A | 7/1988 | Schubert |
| 5,356,509 A | 10/1994 | Terranova et al. |
| 5,776,794 A * | 7/1998 | McCann .................. 438/46 |
| 5,828,088 A | 10/1998 | Mauk |

OTHER PUBLICATIONS

Kish, F.A. et al., Semiconductors and Semimetals vol. 40, Academic Press, 1997, pp. 149–226 (no month given), 1997.*

Room–temperature continuous–wave operation of InGaN multiple–quantum–well laser diodes with an asymmetric waveguide structure By: Kneissl, et al.; Applied Physics Letters, vol. 75, No. 4, Jul. 26, 1999,© 1999 American Institute of Physics, pp. 581–583.

Lateral epitaxy of low defect density GaN layers via organometallic vapor phase epitaxy By: Nam, et al.; Appl. Phys. Lett. 71 (18), Nov. 3, 1997, © 1997 American Institute of Physics, pp. 2638–2640.

* cited by examiner

Primary Examiner—Keith Christianson
(74) Attorney, Agent, or Firm—Fay, Sharpe, Fagan, Minnich & McKee LLP (57) ABSTRACT

A technique based on etching a release layer, for separating the nearly lattice matched substrate from a base substrate is disclosed. A nearly lattice matched substrate for the epitaxial growth of Group-III nitride semiconductor devices and method of fabricating the nearly lattice matched substrate and devices is disclosed. Enhanced ELOG methods are used to create low defect density GaN films. The GaN films are used to grow Group-III nitride LEDs and laser diodes.

32 Claims, 11 Drawing Sheets

TOP VIEW

FIG. 5f
view aa

REMOVABLE LARGE AREA, LOW DEFECT DENSITY FILMS FOR LED AND LASER DIODE GROWTH

STATEMENT OF GOVERNMENT RIGHTS

The U.S. Government has rights in this invention pursuant to Contract No.: MDA 972-96-3-0014 awarded by DARPA.

FIELD OF THE PRESENT INVENTION

The present invention relates to the art of epitaxially grown semiconductors. It finds specific application in the growth of Group III-nitride laser diodes and light emitting diodes (LEDs) and will be described with particular reference thereto. It will be appreciated, however, that the invention is also amenable to other semiconductor devices and integrated circuits.

BACKGROUND OF THE PRESENT INVENTION

The data storage capacity of an optical data storage device, such as a compact disk read only memory (CD ROM) or a digital video disk (DVD), is limited by the wavelength of light used for reading/writing data to/from the storage device. If shorter wavelength light is used, more data may be stored on the storage device because it is possible to "pack" the data in a tighter fashion. Until recently, the light sources for reading/writing data to/from optical data storage devices produced light having relatively long wavelengths (i.e., light in the red and infra red regions of the light spectrum). New laser diodes and light emitting diodes (LEDs), are being developed for use in optical data storage devices. These new laser diodes and LEDs produce light having relatively short wavelengths (i.e., light in the blue, violet, and ultra violet regions of the spectrum). These new light sources have great potential in many areas such as, high resolution full-color printing, advanced display systems, optical communications, electronic device, and high-density optical storage.

One promising group within these new light sources are those based on crystals of Group III-nitrides (e.g., aluminum gallium indium nitride (AlGaInN)). However, progress in developing such Group III-nitride devices has been hampered by difficulties in separating films from the base substrates they are grown on, and by difficulties in producing defect free crystals on which to grow the devices.

A perfect crystal is a form of matter comprised of a regularly repeating arrangement of atoms. The regular repeating nature of the internal arrangement of atoms in a crystal is often apparent to the unaided eye. The plane faces or facets of a crystal, such as a quartz crystal or a sugar crystal, are the result of the regular repeating arrangement of its atoms. Imperfections, or interruptions in that regular atomic pattern, are often visible as well (e.g., when two crystals grow out of one another).

The properties of semiconductor devices stem from the properties of their underlying component crystals. Imperfections or irregularities in the crystals that make up a semiconductor device, at least in some cases, lead to reduced performance characteristics, such as a reduced tolerance to heat, or a shortened operating life time. Laser diodes and LEDs are examples of devices that are adversely affected by imperfections in their component crystals.

The preferred method used to make the new Group III-nitride devices is referred to as "epitaxial growth." Epitaxy is the growth, on a crystalline substrate, of a crystalline substance that mimics the orientation of the atoms in the substrate. The most common substrate for the growth of Group III-nitride light sources known up until recently has been sapphire.

Directly growing Group III-nitrides on sapphire, however, has been found to result in a material having a very large defect density (e.g., approximately $10^{10}/cm^2$). Bulk gallium nitride (GaN) is a better substrate than sapphire for growing Group III-nitride semiconductors. However, methods for growing bulk GaN are problematic. Some require working at high pressures and have not been successful. Other methods, using epitaxial lateral overgrowth (ELOG) techniques to grow GaN films, typically result in the creation of suture defects roughly in the center of what would otherwise be a desirable low defect density GaN film. Furthermore, it is difficult to separate the devices from the base substrates they are grown on.

Figure 1:
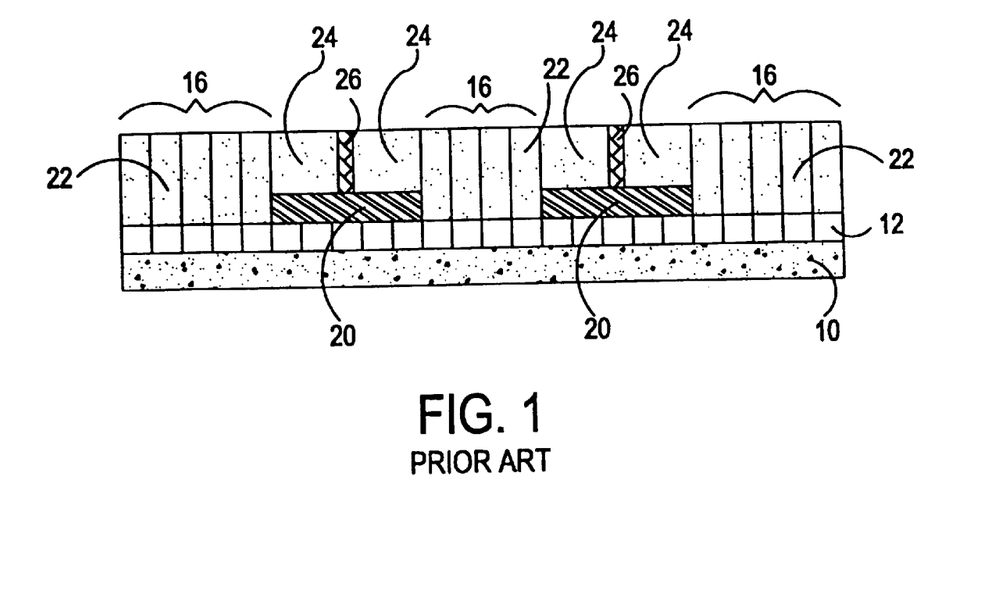
FIG. 1 shows the suture defect created as the result of the known epitaxial lateral overgrowth technique.

The detrimental effect of suture defects in the standard ELOG technique is illustrated in FIG. 1. A GaN nucleation layer 12 covers a base sapphire substrate 10. An $SiO_2$ mask has windows 16 for allowing nucleation and vertical GaN crystal growth. The process of creating the windows 16 in the $SiO_2$ mask also creates mesas 20 of $SiO_2$. The mesas 20 prevent GaN nucleation. During GaN film growth, high defect density GaN 22 grows vertically in the windows 16. The GaN 22 that grows in the windows 16 has a high defect density because it takes on the defect pattern of the underlying nucleation layer 12. The GaN nucleation layer 12 has a high defect density because of the chemical and lattice mismatch with the base sapphire substrate 10. The base sapphire substrate 10 is not a perfect epitaxial substrate for GaN, though it is among the best available.

As the high defect density GaN 22 growth reaches the top of the mesas 20, it begins to laterally overgrow the mesas 20. The mesas 20 block the dislocations of the underlying GaN nucleation layer 12. Therefore, the GaN that overgrows the mesas 20 is relatively free of vertical defects, and, therefore, constitutes a low defect density GaN film 24.

Lateral crystal growth is accompanied by continued vertical crystal growth. In order to have a reasonable final film thickness, it is necessary to use a series of windows in the $SiO_2$ mask As the lateral growth fronts of crystals started from adjacent windows coalesce, dislocations, or irregularities in the pattern of the atoms that make up the crystal, are created, and detrimental suture defects 26 are formed.

These detrimental suture defects 26 effectively cut the usable low defect density area in half. Very accurate lithographic techniques are then required in order to use the low defect area that is produced. Furthermore, one way to separate Group III-nitride devices from sapphire substrates is by laser ablation. Separation by laser ablation requires the use of a laser homogenizer and a stepper to move the beam around the substrate. Very accurate lithography and laser ablation techniques are slow and expensive. A better technique is needed for providing bulk substrates that are nearly lattice matched to III-nitride materials for epitaxial growth of semiconductor devices. Furthermore, a simpler and less expensive method for separating newly grown Group III-nitride film from its base substrate is also needed.

The present invention takes advantage of the fact that the Group III-nitrides and other films of interest, are impervious to most mask/release layer material etchants and provides a new and improved method for releasing films from substrates. Furthermore it provides a new and improved method for creating a suitable substrate for epitaxially growing Group III-nitride semiconductor devices. Therefore, it also provides new and improved Group III-nitride semiconductor devices.

SUMMARY OF THE INVENTION

One aspect of the present invention is a method for separating a film from a base substrate. The method comprising the steps of: depositing a release layer material above the base substrate for forming a release layer; growing a film over the release layer; and, etching the release layer with an etchant to separate the film from the base substrate.

Another aspect of the present invention is a method for the fabrication of a semiconductor device. The method comprises the following steps: Growing a nucleation layer on a base substrate; Depositing a release layer over the nucleation layer; Manipulating the release layer, providing points of access to the nucleation layer for uses as a seed crystal for a film, and blocking defects in the nucleation layer from propagating into at least one region of the film; Growing the film, producing at least one low defect density region in the film large enough for use as a substrate for growing a semiconductor device; Growing at least one semiconductor device on the low defect density region of the film; Removing the substrate and nucleation layer from the rest of the wafer; Applying appropriate contact metallization; and cleaving the device. Of course, the steps do not have to be taken in the order listed.

Yet another aspect of the present invention is a device grown on a separatable film either before or after separation.

A more narrow aspect of the present invention is a laser diode grown on a separatable film either before or after separation.

Another more narrow aspect of the present invention is a light emitting diode grown on a separatable film either before or after separation.

Yet another aspect of the invention is the addition of vias that provide access points for etching chemicals to reach the release layer.

One advantage of the present invention is that it provides a simple technique for separating device wafers from corresponding base substrates.

Another advantage of the present invention is that it provides a means for fabricating semiconductor devices in such a way as to allow for the deposition of metal contacts on the backside of the devices.

Another advantage of the present invention is that it provides a means for fabricating semiconductor devices that can be cleaved from a corresponding wafer for producing high quality device facets.

Another advantage of the present invention is that it produces large areas of low defect density film for the growth of based semiconductors.

Another advantage of the present invention is that it controls the creation of suture defects during the epitaxial overgrowth of crystals, so as to minimize their detrimental effects.

Another advantage of the present invention is that it provides a means for fabricating low defect density semiconductor devices.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating a preferred embodiment and are not to scale. The drawings are not to be construed as limiting the invention.

FIG. 6b shows a support substrate grown on top of the film of FIG. 6a;

DETAILED DESCRIPTION OF THE PREFERRED EMBODIMENTS

One aspect of the invention is a method for the separation of a film from a base substrate by etching a release layer from between the film and the base substrate. It is presented here to provide an overview. The invention will become clearer as one reads the detailed description of the various aspects that follow this introduction.

Film separation can occur before or after devices, such as laser diodes and light emitting diodes (LEDs), are grown on the film. In some cases, for example, when the film is thin and not self-supporting, it may be desirable to provide a top support substrate on the film before separating the film from the base substrate.

In order to increase etchant access to a release layer, vias can be provided. One technique to provide vias, is to etch vias in the film down to the release layer. Another technique is to provide vias in the base substrate and any nucleation layer that might exist, either before or after the film has been grown. Of course, in some cases no special action is required and etching can be allowed to occur simply from the edges of a wafer.

If used, the top support substrate should be perforated where it would otherwise cover vias in the film. When the film does not contain vias, it is not necessary for the support substrate to have vias and instead the support substrate could be continuous.

The previously described aspects of the invention are operations performed on a film grown over a continuous selectively etchable release layer. Depositing selectively etchable release layer material over a base substrate or a base substrate/nucleation layer combination can provide a selectively etchable release layer.

One method for growing the film includes the use of large mesas. In this method film growth can be stopped before portions of the film meet and coalesce. This technique prevents the formation of suture defects. The gaps left between film portions can be used as vias down to the release layer. This method for film growth, therefore, comprises an additional method for providing vias.

Another method for growing the film includes the creation of a lip on mesas of release layer material for positioning suture defects to one side of the mesas.

Conventional methods or other methods can also be used to grow the film over the continuous, selectively etchable, release layer.

These aspects of the invention and others will become clear as one reads the following detailed description of the various aspects of the invention.

With reference to FIGS. 2a–2c, and 7 a wafer 110 is created by growing a nucleation layer 112 over a base sapphire substrate 114 in a step 1000 and depositing an $SiO_2$ release layer 116 over the nucleation layer 112 in a step 1020. Consequently, a sapphire/nucleation layer interface 118 is formed. A mismatch typically exists between the atomic structure of the base sapphire substrate 114 and the atomic structure of the nucleation layer 112. Therefore, dislocations are initiated at the sapphire/nucleation layer interface 118 that continue throughout the nucleation layer 112. A $SiO_2$ release layer 116 is shown. However, another material can be selected as long as an etchant is available that will etch the release layer without having any detrimental effect on the rest of the wafer. Examples of other materials that can be selectively etched include silicon nitride, SiON, and many metals. An example of what the nucleation layer can be made of is GaN, although the nucleation layer can also include for example any III-nitride material such as AlGaN, InN, AlN or other layers that would enable the overgrowth of a III-nitrides. Furthermore, any material can be used for the base substrate as long as it has chemical and structural properties that enable the growth of films of interest. An example of another material that can be used as a base substrate to grow Group III-nitride films is SiC.

Figure 2A:
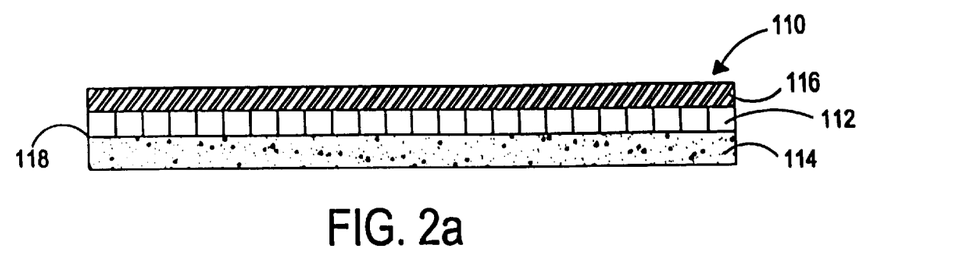
FIGS. 2a–2c show various stages of a first method to form a low defect GaN film in accord with the present invention.
Figure 2B:
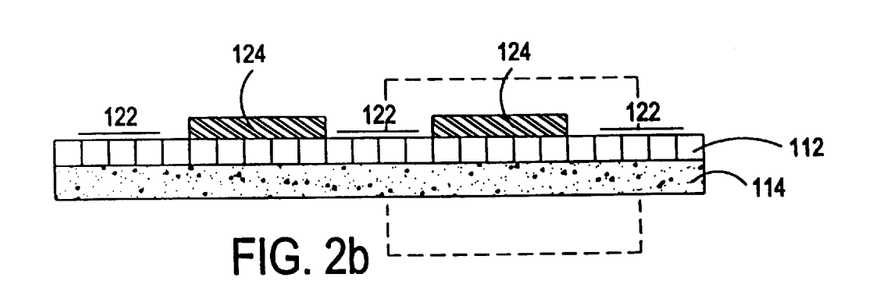

FIG. 2b illustrates the wafer after the $SiO_2$ release layer (116 in FIG. 2a) has been lithographically patterned, in a step 1020, for opening windows 122. Mesas 124 represent portions of the $SiO_2$ layer remaining after the patterning step 1020. The respective widths of the mesas 124 are wide relative to the respective widths of the windows 122. The desired fill factor (window/mesa ratio) has been found to depend on the growth parameters to enable smooth film surfaces. Typical dimensions are from 3–5 um for the window and 8–15 um for the mesas.

Figure 2C:
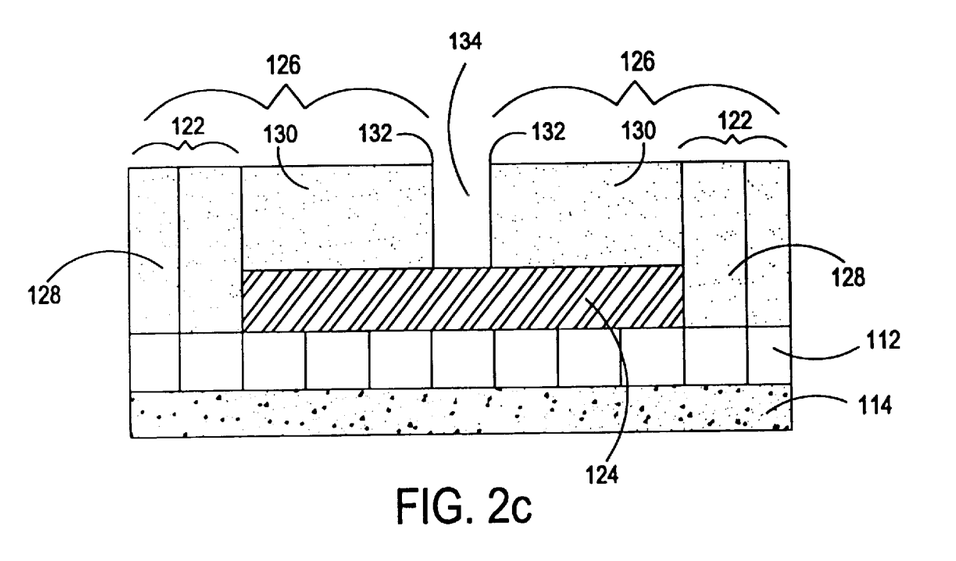

FIG. 2c illustrates a portion of the wafer outlined by dashes in FIG. 2b, after a Group III-nitride (e.g., GaN) film 126 is grown on the wafer in a step 1020. The GaN film 126 is grown vertically and laterally over the mesas 124. The vertically grown GaN film 128 has a high defect density while the laterally grown GaN film 130 has a low defect density. The lateral growth rates of the low defect density GaN film 130 are at least twice the vertical growth rates. Therefore, large area coverage of the respective mesas is achieved without growing very thick films. As shown in FIG. 2c, the growth of the GaN film 130 can be terminated before the two lateral growth fronts 132 meet, thereby producing relatively large areas of the low defect density material 130 and a via 134 to the release layer material at mesa 124. At this point the wafer can be processed further, for example, in a manner similar to that described below in conjunction with FIGS. 4a–4g.

Figure 3A:
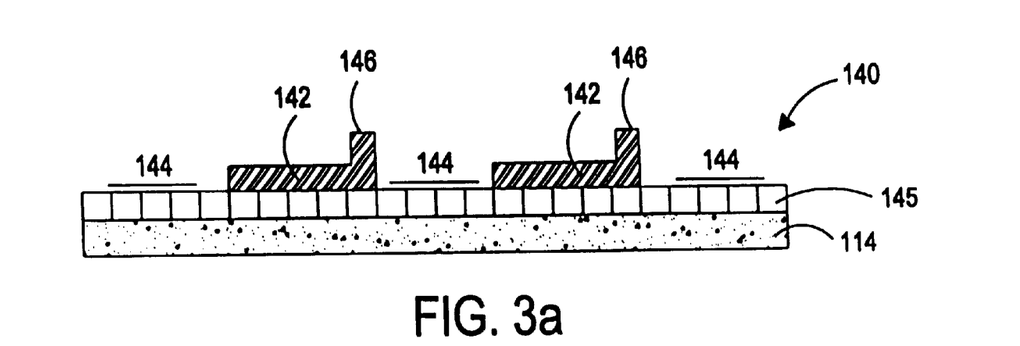
FIGS. 3a–3b show various stages of a second method to form a low defect GaN film in accordance with the present invention.
Figure 3B:
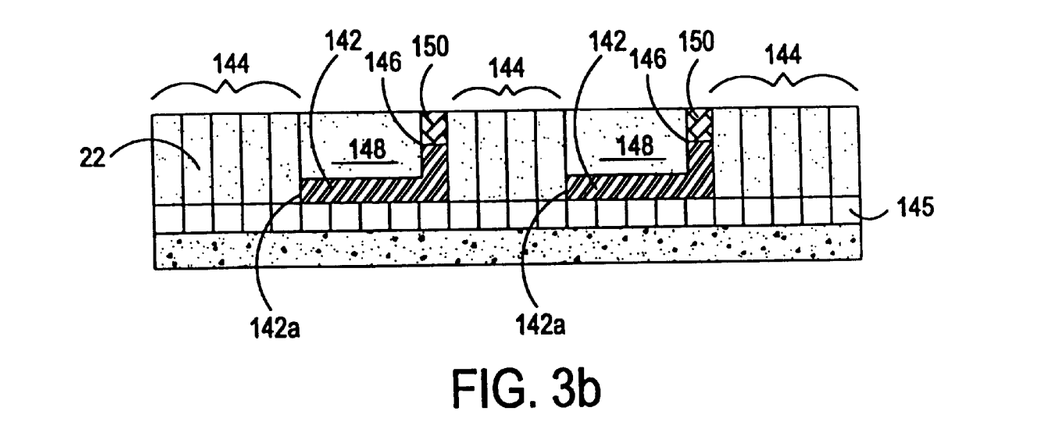

A wafer 140 created according to a second method in accord with the present invention is shown in FIGS. 3a–3b. The step 1000 is similar to the one described above and, therefore, is not described again. Referring to FIG. 3a, a ratio of a mesa 142 width relative to a window 144 width of the standard ELOG process can be maintained. However, in the step 1020 the $SiO_2$ release layer is patterned in two stages. In the first stage, the standard windows 144 (similar to the windows 122 in FIGS. 2b and 2c) are opened to an underlying nucleation layer 145. In the second stage, a small region at one edge of each of the mesas 142 is masked while the remainder of the respective mesa 142 is etched to about half its original thickness, thereby creating respective lips 146 at one side of each of the mesas 142.

FIG. 3b illustrates a wafer after the $SiO_2$ layer has been etched into mesas 142, high defect density GaN has been grown in windows 144. The mesas have lips 146. Low defect density GaN film 148 has been grown over the mesas 142 in step 1020. When this method is used, lateral overgrowth begins sooner on respective sides 142a of mesas 142 without the lip 146. The lip 146 prevents the GaN in portions of windows 144 adjacent the lip 146 from growing laterally over the mesas 142. Instead, the GaN is forced to continue growing vertically until it reaches the top of the lip 146. For suitably chosen dimensions, the time when the vertically growing GaN reaches the top of the lip 146 substantially coincides with the time when the laterally growing low defect density GaN film 148, from the opposite side 142a of the respective mesa, reaches a corresponding point on the respective lip 146. In this manner, suture defects 150 are effectively moved from the middle of the mesas 142 (see detrimental suture defect 26 in FIG. 1) to one edge of the mesas 142, thus doubling the width of the low defect density GaN Film available for device growth.

Figure 3C:
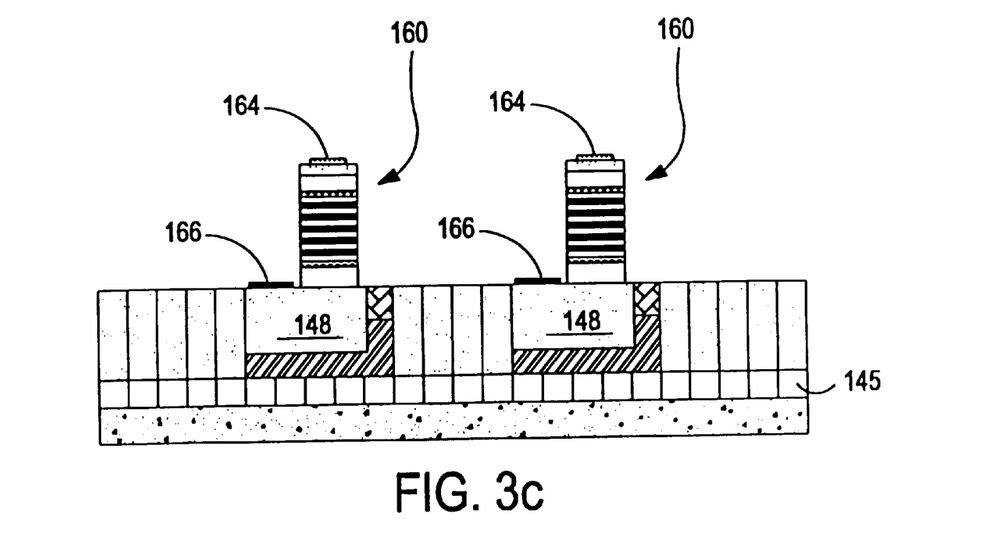
FIG. 3c shows a device grown on the film created by the method of FIGS. 3a–3b in accord with the present invention.

It is possible to grow devices on the low defect density film at this point, though it is usually beneficial to continue film growth processing as describe below in regard to FIGS. 4a–4f If devices are grown at this point, the suture defect 150 can be beneficially used as a marker to aid further device processing. Referring to FIG. 3c, in a step 1080, devices 160 are grown on low defect density lateral overgrowth of the low defect density GaN film 148. Metallization processes provide contacts 164 and 166 on the devices 160 and on the front side of the low defect density GaN film 148.

When devices are not grown as shown in FIG. 3c, film growth processing can be continued. A wafer created according to a third method of the present invention is shown in FIGS. 4a–4e. This third method provides a relatively larger defect free region than the previously described methods.

Figure 4A:
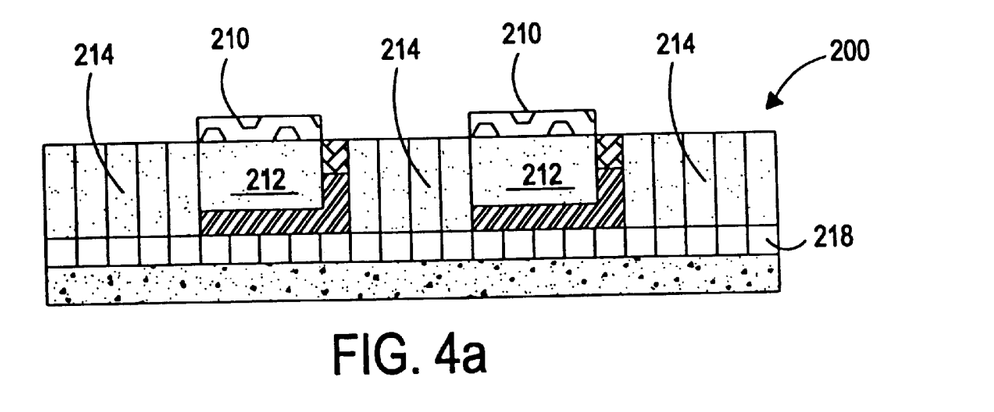
FIGS. 4a–4e show various stages of a third method to form low defect GaN films in accord with the present invention.

FIG. 4a shows a wafer 200 including a photoresist 210 applied to a low defect density GaN Film 212 during the step 1020. The wafer 200 is then etched to remove all high defect density GaN 214 down to a nucleation layer 218.

Figure 4B:
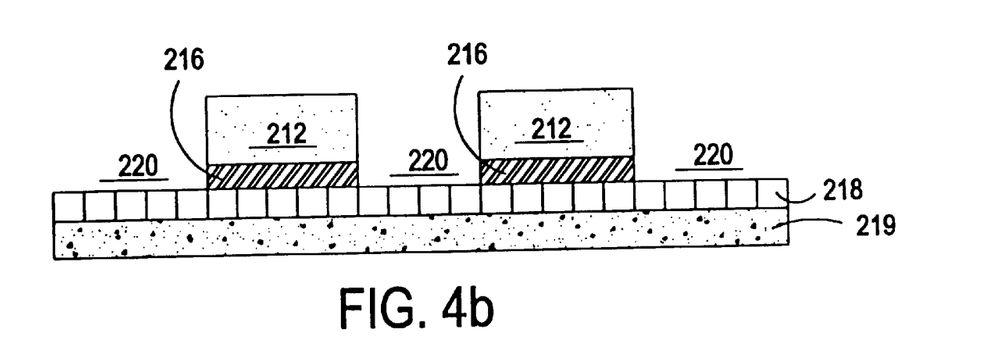

FIG. 4b shows the wafer after the high defect density GaN has been etched away, in a continuation of step 1020. Low defect density GaN films 212 are supported by respective $SiO_2$ mesas 216. The $SiO_2$ mesas 216 are supported by the nucleation layer 218 and base sapphire substrate 219. The nucleation layer 218 is exposed at all other places on the wafer, i.e.; in windows 220.

Figure 4C:
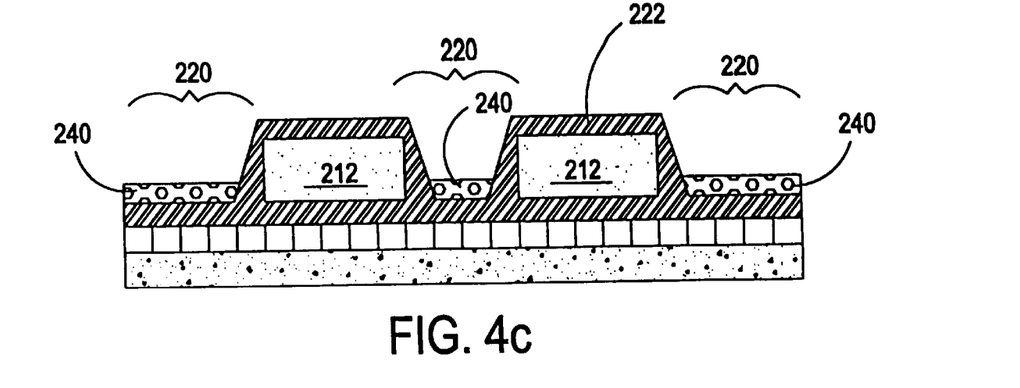

Next, referring to FIG. 4c, the wafer is covered with an $SiO_2$ release layer 222 during the step 1020. Preferably, the thickness of the $SiO_2$ layer 222 is substantially equal to the thickness of the original $SiO_2$ layer (see 216 of FIG. 4b). The purpose of this stage (step 1020) is to refill the windows 220 with $SiO_2$ in order make the release layer continuous to prepare the wafer for further GaN film growth and separation.

If the $SiO_2$ is deposited on portions of the wafer other than the windows 220, as shown in the FIG. 4C, then a photoresist 240 is applied in the windows 220 during the step 1020. The photoresist 240 protects the $SiO_2$ layer 222 deposited in the windows 220 during the step 1020. The remainder of the newly deposited $SiO_2$ layer 222 is excess. The excess $SiO_2$ layer 222 is removed with an etchant (e.g., buffered Hydrogen Fluoride "HF") that is chosen for its ability to selectively etch the release layer, and for its benign effect on the rest of the wafer. Alternatively another etching technique, such as dry etching in $CF_4/O_2$ plasma, during the step 1020 can be used. In any event, after etching, the photoresist 240 is removed.

Figure 4D:
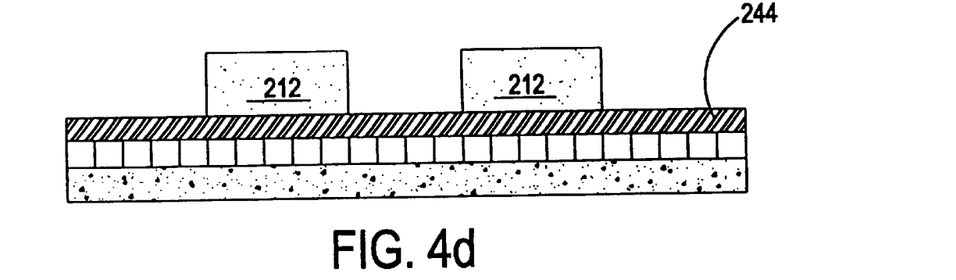

Referring to FIG. 4d, after etching and after the photoresist is removed, mesas or portions 212 of low defect density GaN rest on a continuous layer of $SiO_2$ to create an $SiO_2$ release layer 244. Next, during the step 1060, GaN film growth is resumed using a growth technique capable of growing thick films of GaN (e.g., hydride vapor phase epitaxy (HVPE)). GaN film growth resumes from the low defect density GaN mesas or portions 212. Therefore, the new growth also has a low defect density. Growth continues both laterally and vertically until the crystals started on adjacent GaN mesas 212 meet and coalesce.

Figure 4E:
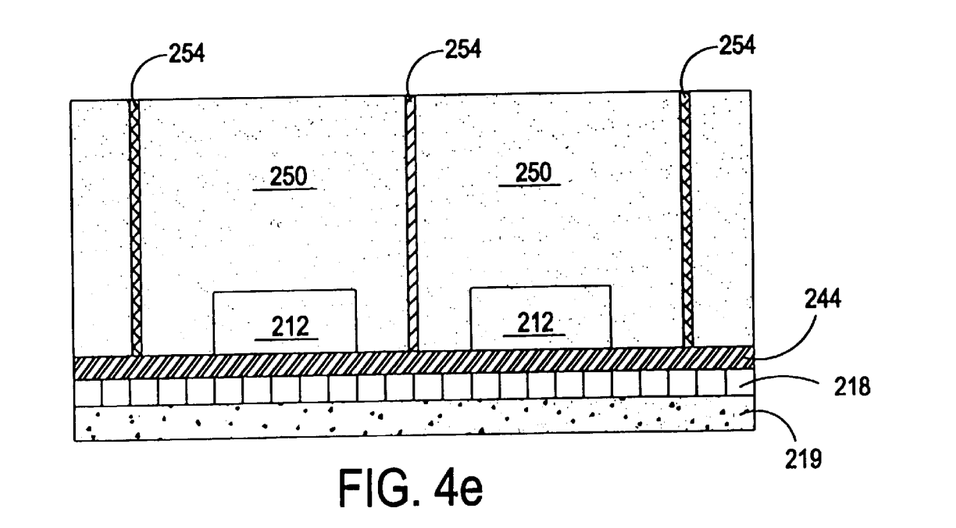

FIG. 4e shows the wafer after a GaN film 250 has grown to the point that the crystals started on adjacent GaN mesas or portions 212 have met and coalesced. Although suture defects 254 are present, the defects 254 are located on edges of relatively wide low defect density GaN film regions 250. Voids (not shown) may be present under the suture defects 254. The voids (not shown) can extend back to the sides of the original low defect density GaN mesas or portions 212. At this point, semiconductor devices in general, and Group III-nitride semiconductor devices in particular, may optionally be epitaxially grown on the low defect density GaN film 250. Preferably, however, the film is separated from the base substrate and devices are grown after separation. In some cases, as will be discussed later, a new support substrate may be beneficially attached to the top of the film 250 before substrate removal. The support substrate can be bonded to the top of the film. The support substrate can also be grown by methods such as, for example, electrodeposition or any other technique that enable thick film growth. Support substrate growth is not shown here. In either case, the wafer is immersed in an etchant (e.g., HF), during the steps 1100 or 2100, in order to dissolve the $SiO_2$ release layer 244, thereby separating the upper portion of the wafer from the nucleation layer 218 and the base sapphire substrate 219.

Figure 4F:
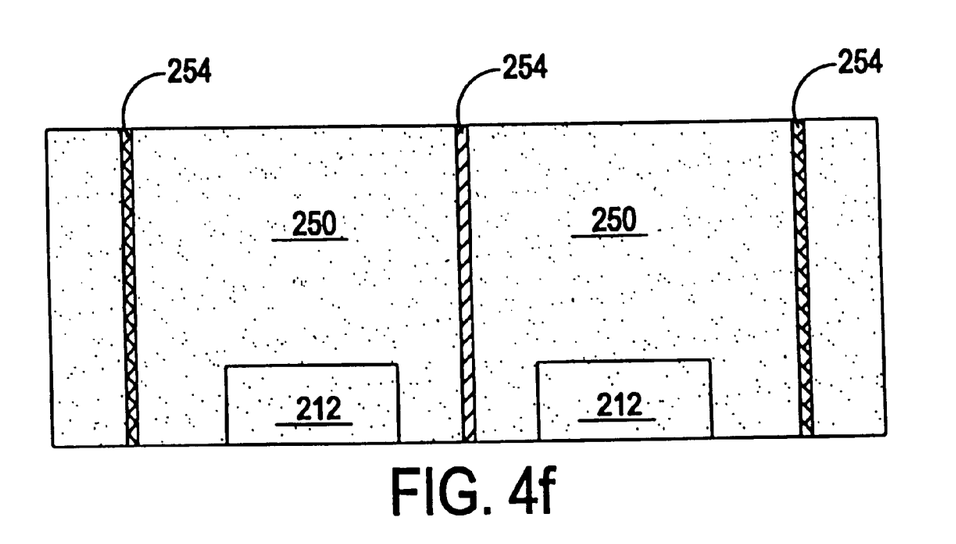
FIG. 4f shows the film of FIG. 4e after the film has been separated from the base substrate.

As is shown in FIG. 4f, the film 250 is separated from the base substrate without a support substrate and before device growth.

Figure 4G:
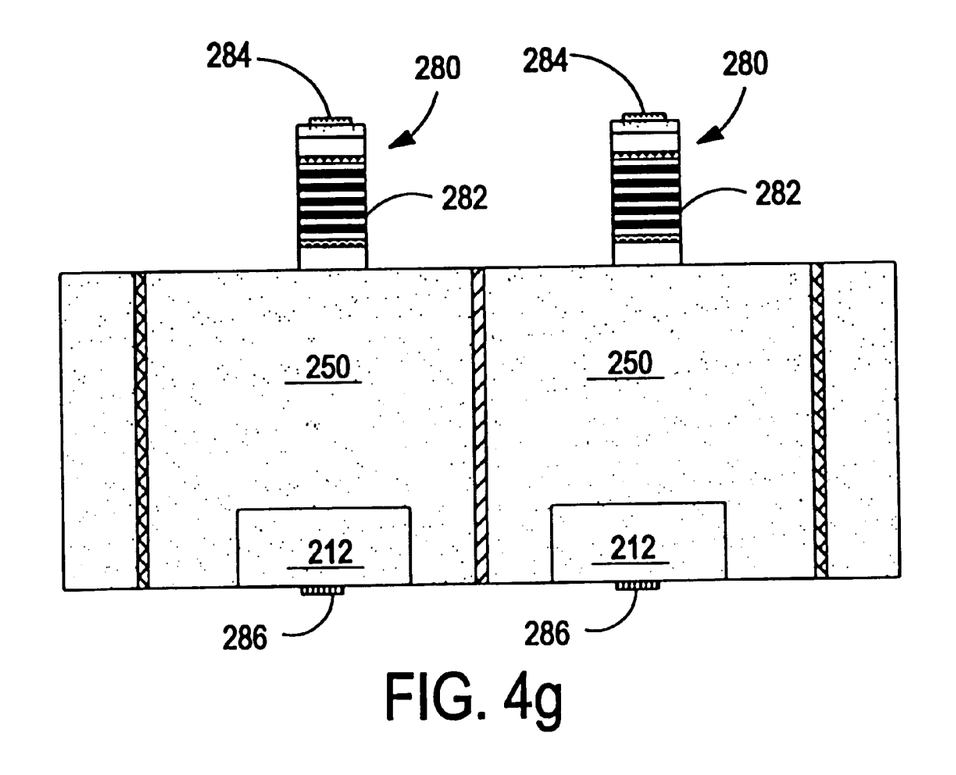
FIG. 4g shows devices grown on the freestanding film of FIG. 4F.

Film separation from the base substrate enables a freestanding device that can be electrically contacted from the backside. Using backside electrical contacts assures uniform current distribution and reduces device resistance by eliminating lateral spreading resistance. The use of backside contacts simplifies the architecture of front side contacts, Devices fabricated this way are therefore more efficient and reduce the amount of heat within the device. Furthermore, separating the device from the base sapphire substrate 219 improves thermal conductivity. An example of freestanding devices is shown in FIG. 4g. Group III-nitride semiconductors 280 are grown, during the step 2080, on respective low defect density GaN film regions 250 of the wafer. The device 280 shown is a multiple quantum well laser diode having an MQW active region 282. However, other devices, including light emitting diodes, are also contemplated. Metal contacts 284 (e.g., p-contacts) are deposited on a top portion of the device 280. A contact, such as an n-contact 286 is beneficially applied to the back or bottom side of the low defect density film 250. Obviously, devices can be grown either p-side up or n-side up. At this point the individual devices 280 can be cleaved from the wafer, producing high quality device facets. Cleaved facets are simpler, cheaper, and faster to process. They do not require photolithography. The maximal flatness of cleaved facets minimizes optical losses.

Figure 5A:
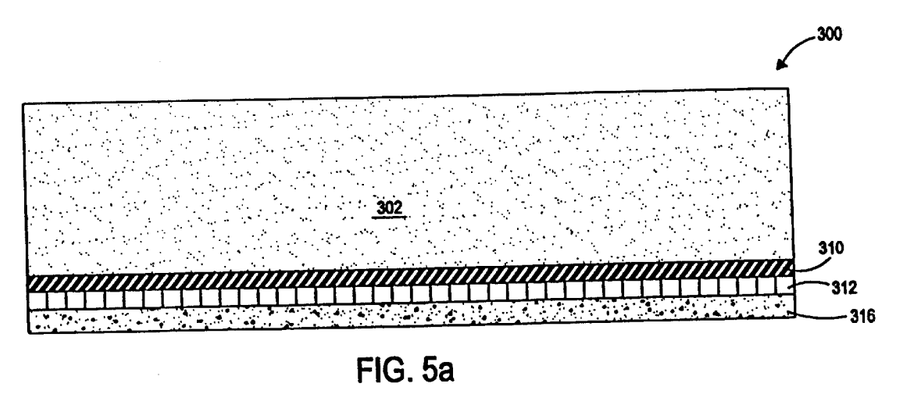
FIGS. 5a–5f show various stages of a supplemental process in accord with the present invention that aids the process of $SiO_2$ dissolution at the point of separating the devices from the nucleation layer and base sapphire substrate.

Modifications can be made to the previously described methods that facilitate the separation step 1100 or alternative separation step 2100. FIG. 5a illustrates a wafer 300 including a GaN film 302. The wafer 300 represents a wafer produced by any of the previously described methods, though it most closely resembles the wafer of FIG. 4e. The GaN film 302 sits on an $SiO_2$ release layer 310. The $SiO_2$ layer 310 is deposited over a nucleation layer 312, which is grown over a base sapphire substrate 316.

Figure 5B:
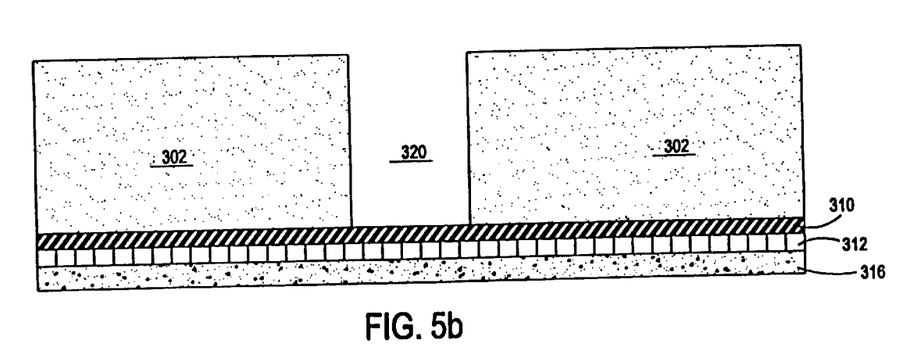

FIG. 5b illustrates the wafer including a via 320. The via acts as an access point to the $SiO_2$ layer 310. The via 320 is etched by an appropriate etching technique, such as chemically assisted ion beam etching (CAIBE). Furthermore, the via 320 is preferably placed, for example, every three (3) millimeters along the wafer 300. The number of vias used is a function of a thickness of the $SiO_2$ layer and the desired time for dissolving the $SiO_2$ layer.

It is to be understood that devices may be grown in a step 1080 as previously described after vias are created. Since it is more complicated to separate the film from the base substrate (in a step 2100) after devices growth, the details of that technique are described below. It is to be understood that when the film is separated (in step 1100) before device growth (in step 2080) only a portion of the technique describe below need be applied.

Figure 5C:
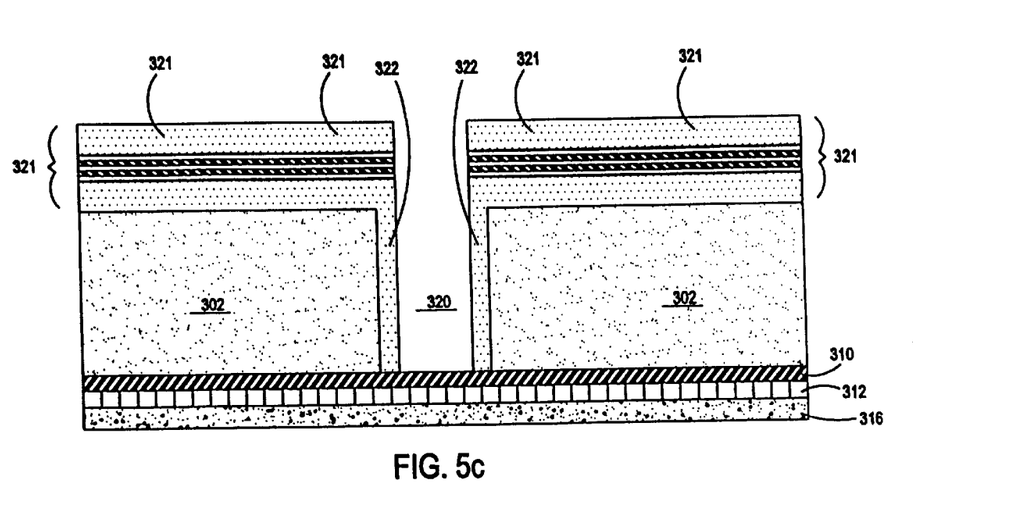

FIG. 5c illustrates the wafer with devices 321 grown on it. It is to be noted that as the devices 321 are grown, some growth 322 into the via 320 can occur, thereby reducing the width of the via 320. Therefore, the width of the original via 320 must be chosen to compensate for this growth 322.

In order to take full advantage of the access to the release layer 310 that the via 320 provides, there should be no metal deposited on the release layer 310 at the time of release layer etching. There are a number of ways to achieve this goal. For example, a photoresist plug can be used to protect the via 320 and release layer 310 during metal deposition. An example of another technique is to allow metal to be deposited on the release layer and then use a metal etching step to remove the metal deposited on the release layer 310. An example of yet another technique that can prevent metal deposition on the release layer 310 is to use angle evaporation. In angle evaporation, the release layer 310 is protected from metal deposition because it is in the shadow of the walls of the via 320 with respect to the metal deposition tool.

Figure 5D:
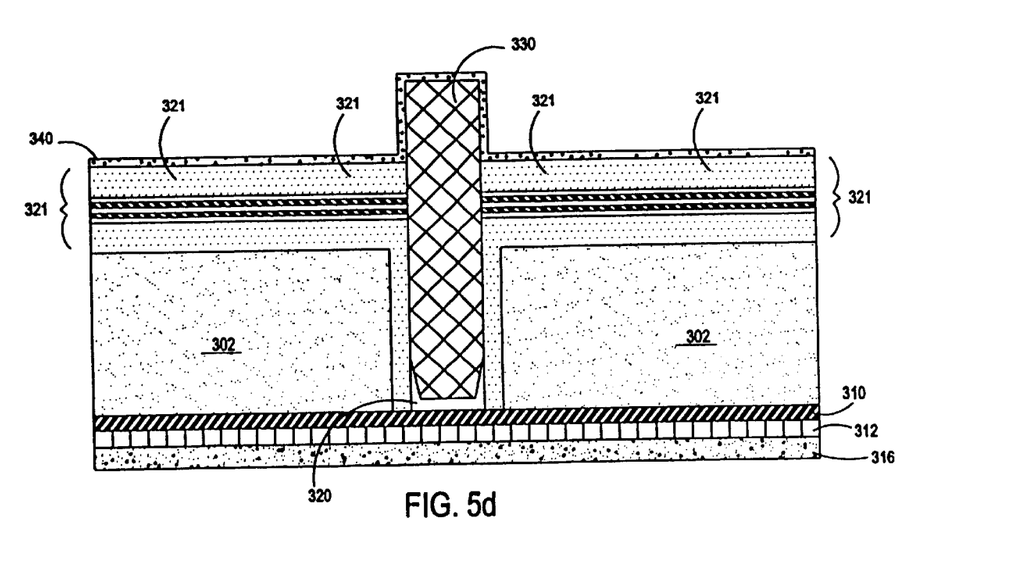

FIG. 5d illustrates the wafer with a photoresist plug 330 deposited in the via 320. The photoresist plug 330 prevents subsequently deposited metal (e.g., during the step 1080), from being deposited on the $SiO_2$ layer 310. Metal deposited on the $SiO_2$ layer 310 would reduce the $SiO_2$ etch rate. A contact metal layer 340 (e.g., a p-contact layer) is deposited on the device 321. At this point, the photoresist plug 330 and the portion of metal layer 340 covering it are removed with photoresist remover.

Figure 5E:
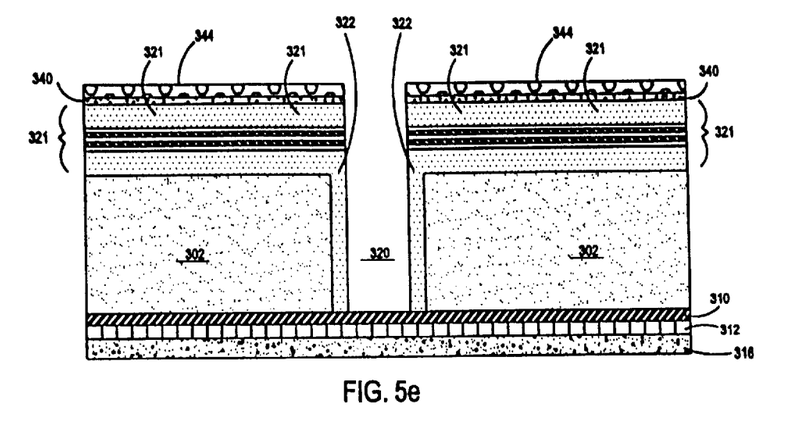

FIG. 5e illustrates the wafer with a layer of photoresist 344, which is deposited everywhere except over the via 320, in preparation for etching the SiO$_2$ layer 310 through the via 320. If the photoresist plug technique is not used and metal is deposited on the release layer 310, a metal etching step can be used to remove the metal from the release layer at this point. As described above, when the release layer 310 is essentially free of metal, the SiO$_2$ layer 310 may be etched by immersing the wafer in an etchant (e.g., HF). HF will also selectively etch other materials including, for example, silicon nitride, and SiON. Of course, where release layer materials are used that are not selectively etchable by HF, other etchants should be used. Where a metal is used as the release layer material, for example, an etchant that selectively etches the metal should be used.

Figure 5F:
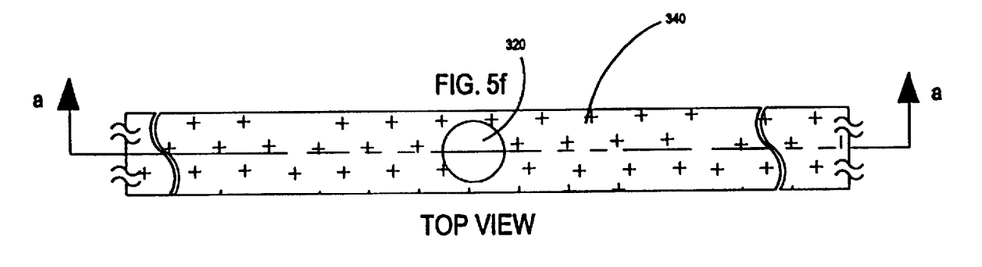

FIG. 5f illustrates the wafer after it has been etched and separated from the nucleation layer and base sapphire substrate (312 and 316 in FIG. 5e). The top view is to make it clear that the section view taken at AA is of one complete portion of the wafer and not two separate pieces. A metal contact layer 346 (e.g., an n-contact) is optionally deposited on a bottom portion of the GaN film 302.

Figure 6A:
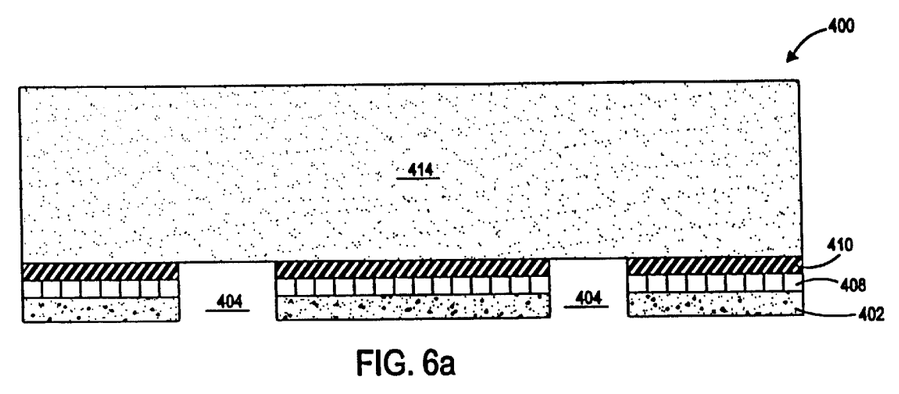
FIG. 6a shows an alternate to the via illustrated in FIGS. 5a–5e.

FIG. 6a illustrates another method for providing vias to the release layer. Here a wafer 400 including a base substrate 402 with vias 404 in it is shown In this example the vias 404 were provided in the base substrate 402 before any other wafer processing. However, the vias 404 can be provided at other points in the wafer processing procedure. The vias 404 continue through a nucleation layer 408 since the nucleation layer is grown on the base substrate 402 after the vias 404 are provided. Additionally, the vias 404 continue through the release layer 410. Some growth on the sidewalls of the vias 404 may occur during nucleation layer growth That growth is not shown in the figure. Similarly, some release layer material may be deposited on the sidewalls of the vias 404. Release layer deposition onto the sidewall of the vias 404 is not shown in the figure. The release layer 410 supports a film 414 grown by a technique that includes lateral growth. The lateral component of film 414 growth allows it to grow over the vias 404. In the figure, the film 414 is shown completely covering the vias 404. This is not always the case. Whether or not a film covers the vias completely depends on a number of factors, including, for example, the via diameter, the films lateral growth rate, vertical growth rate and final film thickness.

The vias 404 are preferably provided by laser drilling before film growth, but can also be provided later in the process (e.g., after film growth). Typically, via diameters of about 90 um are acceptable. Of course, when this technique is used, the vias 404 do not need to be plugged with photoresist.

Figure 6B:
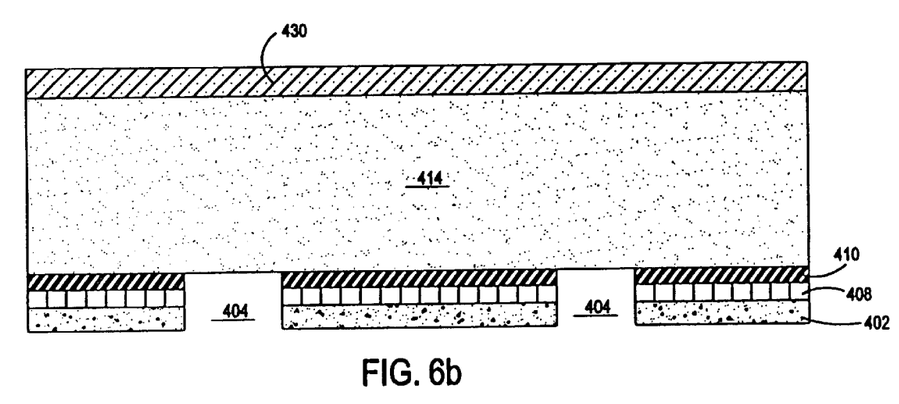
Figure 7:
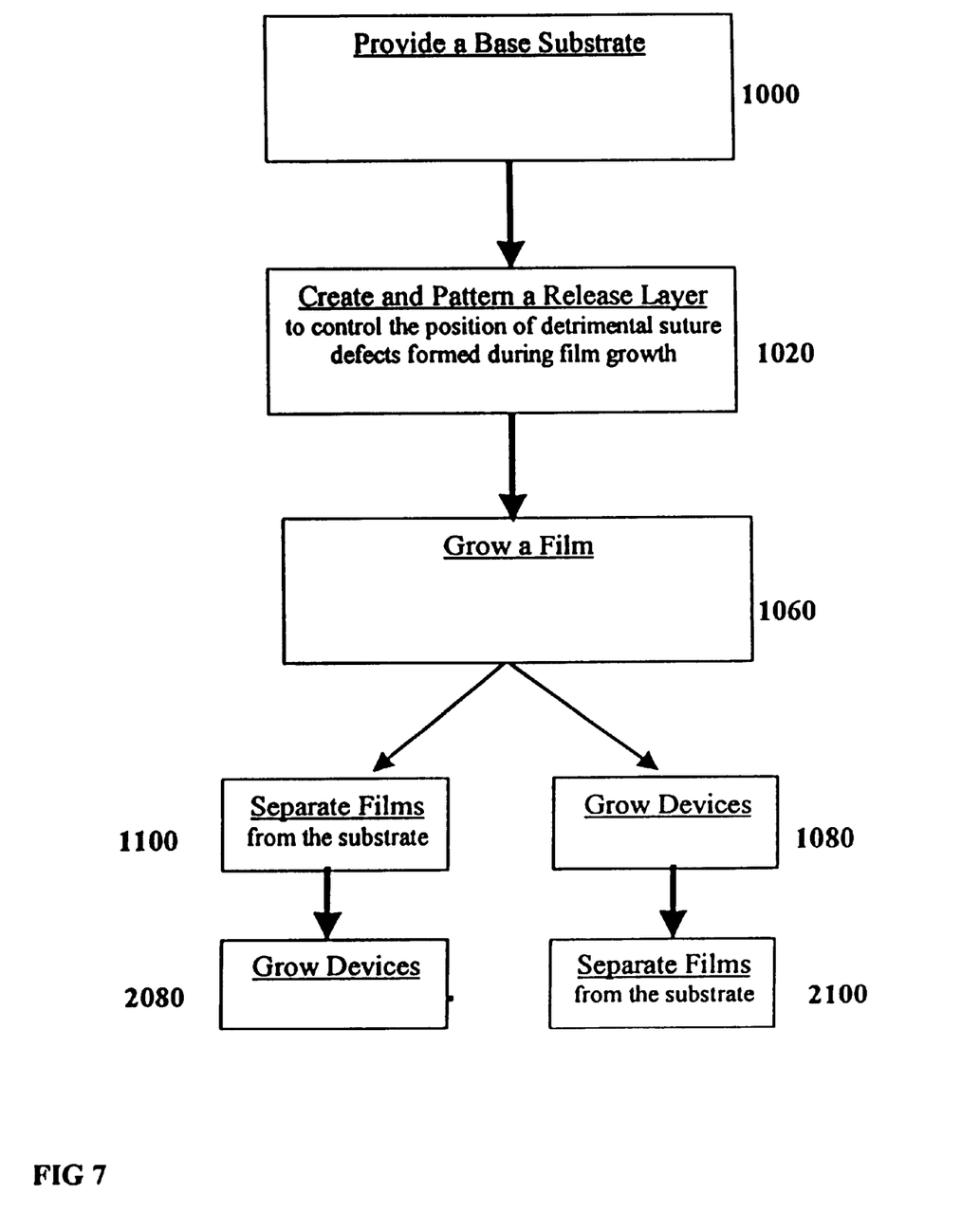
FIG. 7 is a flow chart outlining a method in accord with the present invention.

As mentioned above, in the description referring to FIG. 4e, it is sometimes advantageous to provide a support substrate on top of the film before separating it from the base substrate. Support substrates are generally bonded to films, however, any technique for providing a support substrate may be used. For example, a support substrate may also be grown on a film. FIG. 6b shows a support substrate 430 grown on top of the wafer 400 of FIG. 6a. The support substrate 430 can be added to provide structural support to the film. Some films might need that support after the films are separated from the base substrate. Other reasons to provide the support substrate are to provide a substrate that has improved characteristics over those of the base substrate.

For example, while a base substrate may be used for its compatibility with the film growth process, a support substrate having better thermal and/or electrical conductivity may also be used. A support substrate may also be chosen for its cleavability. One example of such a support substrate is silicon, which has both good thermal, and electrical conducting properties compared to sapphire. Furthermore support substrates such as silicon can be cleaved. Other possible substrates could include for example, SiC and diamond. However, other materials for the support substrate are also contemplated.

A continuous support substrate is shown in FIG. 6b. A similar support substrate might be provided on a film with topside vias, such as via 320 in film 302 in FIG. 5b. In that case, vias are provided in the support substrate. The vias are located at points above the vias 320 in the film After providing a support substrate as shown in FIG. 6B, or after providing a similar support substrate (not shown) on a film (such as the one illustrated in FIG. 5b), the films can be separated from the base substrates (402 in FIG. 6b or 316 in FIG. 5b) and nucleation layers (408 in FIG. 6b or 312 in FIG. 5b), if any, by etching the release layers (410 in FIG. 6b or 310 in FIG. 5b). After that, further growth (e.g., film growth and/or device growth) can continue from the bottom of the film (414 in FIG. 6b or 302 in FIG. 5b).

The invention has been described with reference to the preferred embodiment. However, it is to be understood that other embodiments, including other materials in the various layers, are contemplated. Obviously, modifications and alterations will occur to others upon reading and understanding the preceding detailed description. It is intended that the invention be construed as including all such modifications and alterations insofar as they come with the scope of the appended claims or equivalents thereof.

What is claimed is:

1. A method for separating a film from a base substrate, the method comprising:
   growing a nucleation layer over the base substrate;
   depositing a release layer material above the base substrate for forming a release layer;
   growing a film over the release layer; and,
   etching the release layer with an etchant to separate the film from the base substrate.

2. The method for separating a film as set forth in claim 1 wherein the depositing step includes:
   depositing the release layer over the nucleation layer.

3. The method for separating a film as set forth in claim 2 wherein the growing step includes:
   etching a part of the release layer, for creating windows, exposing portions of the nucleation layer and creating release layer mesas, the mesas having sides adjacent to respective ones of the windows; and,
   growing the film, using the exposed portions of the nucleation layer as seeds.

4. The method for separating a film as set forth in claim 3 further comprising:
   growing the film vertically in the windows and laterally and vertically over the release layer mesas.

5. The method for separating a film as set forth in claim 4 further comprising:
   stopping lateral and vertical film growth over the release layer mesas before the film growing in windows adjacent to the respective sides of the mesas meet and coalesce.

6. The method for separating a film as set forth in claim 3 wherein the step of etching part of the release layer includes:

creating respective lips on the mesas, adjacent to a first set of window portions.

7. The method for separating a film as set forth in claim 6 wherein the growing step further includes:

growing the film laterally over the release layer from a second set of window portions that are not adjacent to the lips, before growing the film laterally over the release layer from the first set of window portions.

8. The method for separating a film as set forth in claim 7 wherein the growing step further includes:

etching film portions in the windows, for exposing the nucleation layer;

depositing release material in the windows for making the release layer continuous; and, continuing film growth from unetched film portions.

9. A method for separating a film from a base substrate, the method comprising:

depositing a material that may be selectively etched with respect to the film selected from silicon dioxide (SiO2), silicon nitride and SiON above the base substrate for forming a release layer;

growing a film over the release layer; and, etching the release layer with an etchant to separate the film from the base substrate.

10. The method for separating a film as set forth in claim 9 wherein the step of etching further includes:

etching with Hydrogen Fluoride (HF).

11. A method for separating a film from a base substrate, the method comprising:

depositing a release layer material above the base substrate for forming a release layer;

growing a Group III-nitride film over the release layer; and, etching the release layer with an etchant to separate the film from the base substrate.

12. A method for separating a film from a base substrate, the method comprising:

depositing a release layer material above the base substrate for forming a release layer;

growing a GaN film over the release layer; and, etching the release layer with an etchant to separate the film from the base substrate.

13. A method for separating a film from a base substrate, the method comprising:

depositing a release layer material above the base substrate for forming a release layer;

growing a film over the release layer;

providing vias in the film, for providing increased access to the release layer for an etchant; and, etching the release layer with the etchant to separate the film from the base substrate.

14. A method for separating a film from a base substrate, the method comprising:

providing vias in the base substrate, for providing increased access to the release layer for an etchant;

depositing a release layer material above the base substrate for forming a release layer;

growing a film over the release layer; and, etching the release layer with the etchant to separate the film from the base substrate.

15. The method for separating a film as set forth in claim 1 further comprising:

providing a support substrate on top of the film before the step of etching the release layer.

16. A method for separating a film from a base substrate, the method comprising:

depositing a release layer material above the base substrate for forming a release layer;

growing a film over the release layer;

providing an electrically conductive support substrate on top of the film before the step of etching the release layer; and, etching the release layer with an etchant to separate the film from the base substrate.

17. A method for separating a film from a base substrate, the method comprising:

depositing a release layer material above the base substrate for forming a release layer;

growing a film over the release layer;

providing a thermally conductive support substrate on top of the film before the step of etching the release layer; and, etching the release layer with an etchant to separate the film from the base substrate.

18. A method for separating a film from a base substrate, the method comprising:

depositing a release layer material above the base substrate for forming a release layer;

growing a film over the release layer;

providing a silicon support substrate on top of the film before the step of etching the release layer; and, etching the release layer with an etchant to separate the film from the base substrate.

19. A method for separating a film from a base substrate, the method comprising:

depositing a release layer material above the base substrate for forming a release layer;

growing a film over the release layer;

providing a support substrate on top of the film, providing vias in the support substrate adjacent to vias in the film;

etching the release layer with an etchant to separate the film from the base substrate.

20. A method for fabricating a semiconductor device, comprising:

growing a nucleation layer on a base substrate;

depositing a release layer over the nucleation layer;

manipulating the release layer for i) providing points of access to the nucleation layer for uses as a seed crystal for a film, and ii) blocking defects in the nucleation layer from propagating into at least one region of the film;

growing the film, producing a low defect density region in the film sized for use as a substrate for growing a semiconductor device;

growing the semiconductor device on the low defect density region of the film;

removing the base substrate and the nucleation layer;

applying contact metallization; and, cleaving the device.

21. The method for fabricating a semiconductor device as set forth in claim 20, wherein the step of applying contacts comprises:

applying a contact to the device, and;

applying an contact to a backside of the film.

22. The method for fabricating a semiconductor device as set forth in claim 20, wherein in the step of removing includes:

selectively etching the release layer.

23. The method for fabricating a semiconductor device as set forth in claim 20, further comprising:
   before the step of growing the device, providing a via through the film to expose at least one portion of the release layer;
   plugging the via with a photoresist plug;
   applying a first contact metallization;
   removing the photoresist plug;
   depositing photoresist over at least one of the film and the device, none of the photoresist being deposited over the via.

24. The method for fabricating a semiconductor device as set forth in claim 22, further comprising:
   depositing a second contact metallization on the backside of the film.

25. The method for fabricating a semiconductor device as set forth in claim 1, further comprising:
   providing vias through the base substrate and nucleation layer to provide additional access points for etchant to reach the release layer.

26. The method for fabricating a semiconductor device as set forth in claim 25, wherein the step of providing vias includes:
   laser drilling the vias through the base substrate.

27. The method for fabricating a semiconductor device as set forth in claim 20, wherein the step of applying contact metallization further comprises:
   using angle evaporation for applying the contact.

28. The method for fabricating a semiconductor device as set forth in claim 20, further comprising:
   before the step of growing the device, providing a via through the film to expose at least one portion of the release layer;
   applying a first contact metallization;
   depositing photoresist over at least one of the film and the device, none of the photoresist being deposited over the via;
   etching metal from within the via.

29. The method for fabricating a semiconductor device as set forth in claim 20 further comprising:
   growing a support substrate on a top of the film before the step of removing the base substrate; and,
   growing the semiconductor device on the bottom of the film after the step of removing the substrate.

30. A semiconductor device fabricated according to the method of claim 20.

31. The device of claim 30 comprising a laser diode.

32. The device of claim 30 comprising a light emitting diode.

* * * * *